United States Patent [19]

Takemae et al.

[11] Patent Number: 4,592,020
[45] Date of Patent: May 27, 1986

[54] SEMICONDUCTOR MEMORY DEVICE HAVING CLAMP CIRCUITS

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 554,338

[22] Filed: Nov. 22, 1983

[30] Foreign Application Priority Data

Nov. 29, 1982 [JP] Japan ................... 57-207507

[51] Int. Cl.$^4$ .............................. G11C 11/40
[52] U.S. Cl. ..................... 365/189; 307/530; 365/182
[58] Field of Search ............. 365/154, 189, 182, 190, 365/203; 307/530

[56] References Cited

U.S. PATENT DOCUMENTS 4,504,929  3/1985  Takemae et al. ............... 307/530

Primary Examiner—Terrell W. Fears
Attorney, Agent, or Firm—Staas & Halsey

[57] ABSTRACT

A semiconductor memory device having clamp circuits, each of which operates reliably without being affected by the resistance of a word line. Each of the clamp circuits is connected to a corresponding word line and clamps the potential of the word line to a reference potential when it is in a non-selected condition. Each of the clamp circuits includes a flip-flop having a first terminal connected to the corresponding word line and a second terminal which receives a control signal for operating each of the clamp circuits. The control signal is applied to the second terminal when the potential of a selected word line exceeds at least the potential necessary for inverting the condition of the flip-flop.

9 Claims, 11 Drawing Figures

Fig. 3A (SELECTED CONDITION)
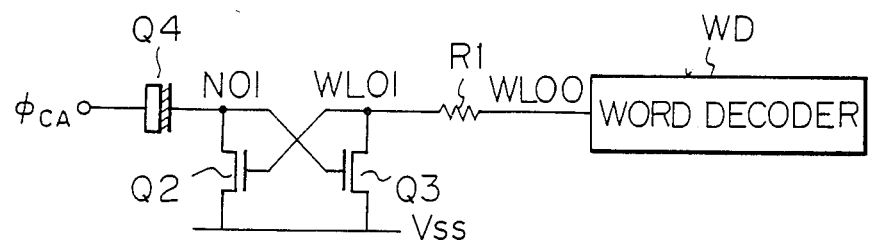
Fig. 3B (NON-SELECTED CONDITION)
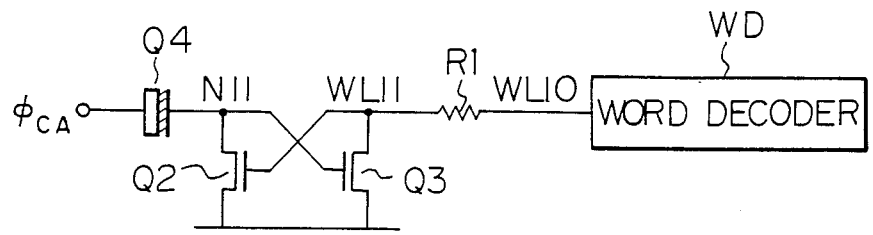
Fig. 4
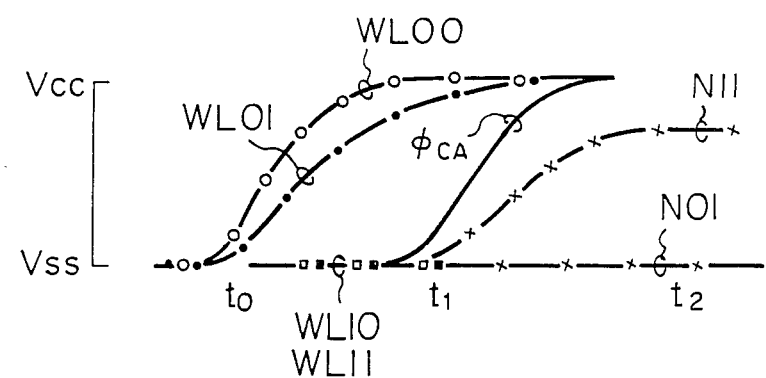

Fig. 5A (SELECTED CONDITION)
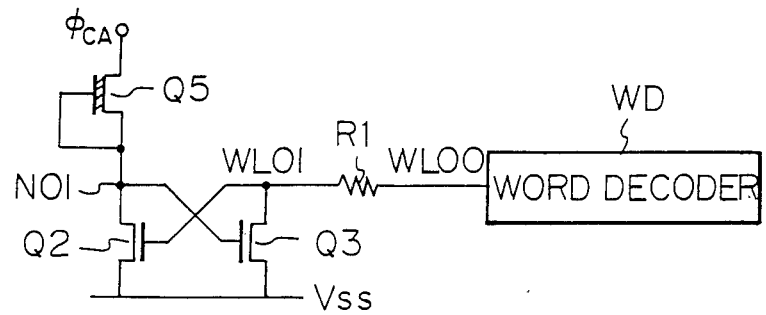
Fig. 5B (NON-SELECTED CONDITION)
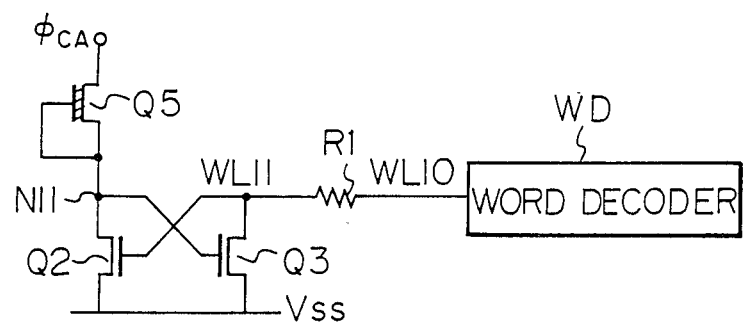
Fig. 6
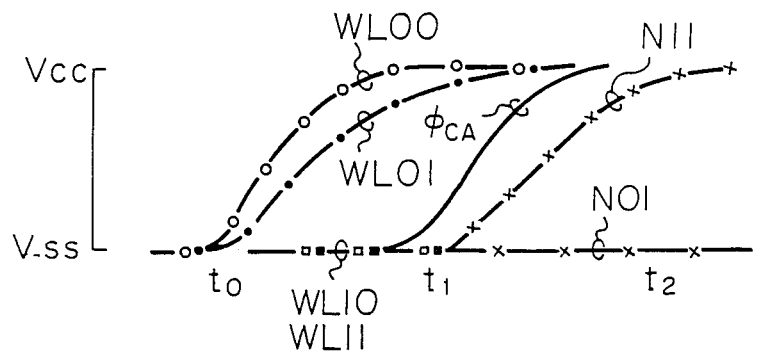

Fig. 7A (SELECTED CONDITION)
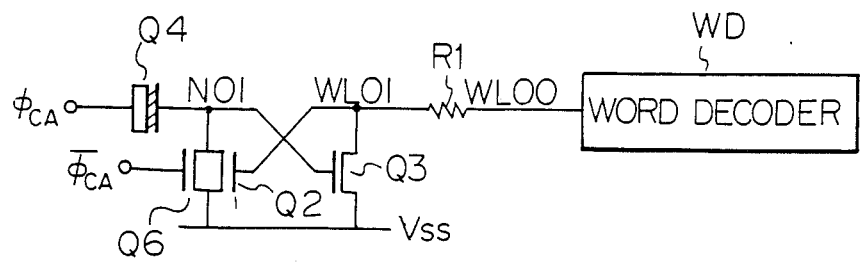
Fig. 7B (NON-SELECTED CONDITION)
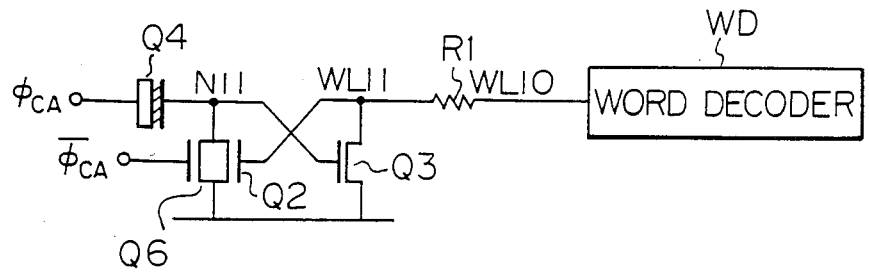
Fig. 8
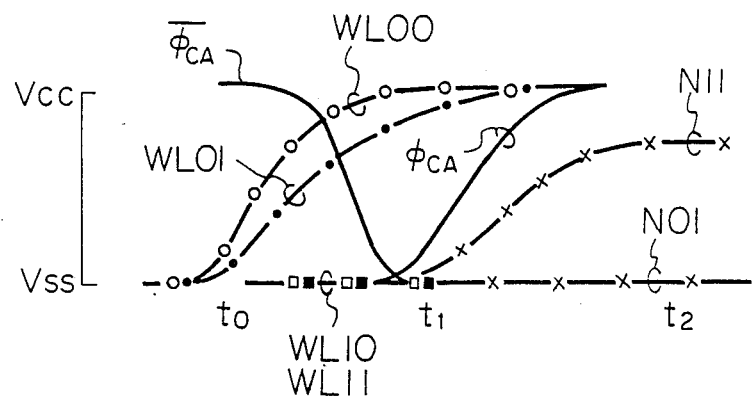

SEMICONDUCTOR MEMORY DEVICE HAVING CLAMP CIRCUITS

BACKGROUND OF THE INVENTION (1) Field of the Invention

The present invention relates to a semiconductor memory device and more particularly to a semiconductor memory device comprising clamp circuits, each of which is connected to an end of a word line and each of which operates reliably without being affected by the resistance of the word line.

(2) Description of the Prior Art

Generally, in a semiconductor memory device having a large memory capacity, there are provided clamp circuits, each clamp circuit being connected to one end of each word line. The clamp circuit is operated in accordance with the selecting voltage input thereto from a word decoder connected to the other end of the word line so that the potential of the word line rises sufficiently when the word line is selected, and so that the potential of the word line is clamped to a low voltage when the word line is not selected, thereby ensuring the selecting operation of the word line.

However, since the operation of each clamp circuit of a conventional semiconductor memory device is greatly influenced by the resistance of a corresponding word line, the selecting operation of the word line is not reliable when the resistance of the word line is relatively high.

SUMMARY OF THE INVENTION

In order to eliminate the above-mentioned problems of conventional semiconductor memory devices, the present invention adopts the idea of operating a clamp circuit after the potential of a word line has become sufficiently high in a semiconductor memory device having a clamp circuit connected to an end of the word line.

It is an object of the present invention to prevent the operation of a clamp circuit from being affected by the resistance of a word line and to make the selecting operation of the word line reliable, thereby improving the overall reliability of a semiconductor memory device.

According to the present invention, this object is attained by providing a semiconductor memory device having clamp circuits, each of which is connected to a corresponding word line and each of which clamps the potential of a non-selected word line to a reference potential. Each of the clamp circuits comprises a flip-flop having a first terminal connected to the corresponding word line and a second terminal which receives a controls signal for operating each of the clamp circuits. The control signal is applied to the second terminal when the potential of a selected word line exceeds at least the potential necessary for inverting the condition of the flip-flop.

BRIEF DESCRIPTION OF THE DRAWINGS

FIGS. 3A and 3B are block circuit diagrams of a word line clamp circuit used in a semiconductor memory device of an embodiment of the present invention.

FIG. 4 is a time chart which explains the circuit of FIGS. 3A and 3B.

FIGS. 5A and 5B are block circuit diagrams of a word line clamp circuit used in a semiconductor memory device of another embodiment of the present invention;

FIG. 6 is a time chart which explains the operation of the circuit of FIGS. 5A and 5B;

FIGS. 7A and 7B are block circuit diagrams of a word line clamp circuit used in a semiconductor memory device of still another embodiment of the present invention; and FIG. 8 is a time chart which explains the operation of the circuit of FIGS. 7A and 7B.

DESCRIPTION OF THE PREFERRED EMBODIMENTS

Before describing the embodiments of the present invention, a conventional semiconductor memory device is explained with reference to FIGS. 1 and 2.

Figure 1:
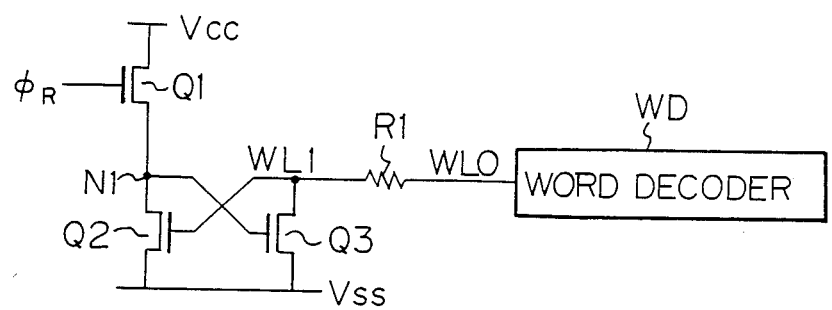
FIG. 1 is a block circuit diagram of the structure of a conventional word line clamp circuit.
Figure 2:
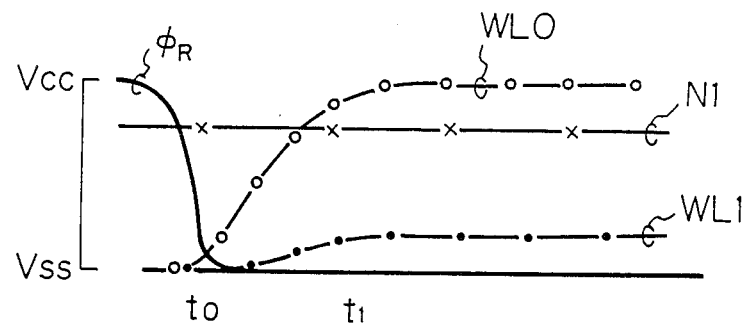
FIG. 2 is a time chart which explains the operation of the circuit of FIG. 1.

FIG. 1 is a clamp circuit used in a conventional semiconductor memory device. The clamp circuit of FIG. 1 is composed of mutually cross-coupled metal-insulator-semiconductor (MIS) transistors Q2 and Q3, an MIS transistor Q1 connected between a high-voltage power source $V_{CC}$ and the MIS transistor Q2, and so on. The symbol R1 indicates an equivalent resistor of a word line, and to both ends of this resistor R1, i.e., the word line, are connected a word decoder WD and the drain of the transistor Q3 of the clamp circuit.

The operation of the clamp circuit of FIG. 1 is described with reference to FIG. 2. At or before the time $t_0$, i.e., during a reset period, since the reset signal $\phi_R$ is high, the potential of the node N1 is charged to a high level via the transistor Q1, and the transistor Q3 is turned on. At a time near the time $t_0$, the reset signal $\phi_R$ becomes low and the output WL0 of the word decoder WD rises. In this condition, since the transistor Q3 is turned on, the potential of the drain WL1 of the transistor Q3 rises in accordance with the ratio determined by the resistance of the resistor R1 of the word line and the gm of the transistor Q3. When the potential of the node WL1 reaches a potential which is equal to or higher than the threshold voltage of the transistor Q1, the transistor Q2 is turned on and the potential of the node N1 falls to approximately that of a low-voltage power source $V_{SS}$. Thereby, the transistor Q3 is turned off and the potential of the node WL1 further rises.

In the above-mentioned conventional semiconductor memory device, however, if the resistance of the resistor R1 of the word line is too large, the potential of the node WL1 does not rise higher than or equal to the threshold potential of the transistor Q2, with the result that the transistor Q2 is not turned on. Therefore, as is illustrated in FIG. 2, the potential of the node WL1 does not rise even at or after the time $t_1$, and the selecting operation of the word line is not performed reliably. In recent large-capacity semiconductor memory devices, the word lines are very thin and polycrystalline silicon and the like are often used as the material thereof. Therefore, the resistance of each word line is relatively high and the possibility of the above-mentioned disadvantages arising becomes very high.

According to the present invention, there is provided a semiconductor memory device which overcomes these problems.

The embodiments of the present invention are explained with reference to the drawings. FIGS. 3A and 3B illustrate the structure of a clamp circuit as an embodiment of the present invention. In FIG. 3A, the signal at each portion in the selected word line is shown. In FIG. 3B, the signal at each portion in the nonselected word line is shown. The clamp circuit of FIGS. 3A and 3B comprises cross-coupled MIS transistors Q2 and Q3 and a depletion-type MIS capacitor Q4 connected to the drain of the transistor Q2. The MIS capacitor Q4 is composed of a depletion-type MIS transistor whose source and drain are mutually connected to form one terminal and whose gate is used as the other terminal, thereby forming a capacitor. Since the MIS capacitor Q4 is composed of a depletion-type transistor, it operates as a capacitor even when the potential of the gate is lower than that of the source and the drain. In the circuit of FIGS. 3A and 3B, the drain of the transistor Q3 is connected to one end of the word line which has the same resistance as that of the resistor R1. The other end of the word line is connected to the word decoder WD.

The operation of the circuit in FIGS. 3A and 3B is explained with reference to FIG. 4. When the word line is in a selected condition, the output WL00 of the word decoder WD shown in FIG. 3A rises at the time $t_0$. In this case, both drains of the transistors Q2 and Q3 are, at first, at a low level, and, consequently, each of the transistors Q2 and Q3 is cut off. Therefore, the drain potential WL01 of the transistor Q3 rises to a high-voltage power source $V_{CC}$ without being affected much by the resistance of the resistor R1 of the word line, and thereby the transistor Q2 is turned on. At the time $t_1$ when the potential WL01 has risen to a sufficiently high level, even if a clamp-activating clock $\phi_{CA}$ applied via the MIS capacitor Q4 is rendered high, the drain potential N01 of the transistor Q2 is maintained at a low level because the transistor Q2 is in a turned-on condition. Therefore, the transistor Q3 is maintained in a cutoff condition. If the word line is in a non-selected condition, the ouput potential WL10 of the word decoder WD and the potential WL11 of an end of the word line shown in FIG. 3B are both at a low level, and, therefore, both of the transistors Q2 and Q3 in the clamp circuit are in a cutoff state. At the time $t_1$, if the clamp-activating clock $\phi_{CA}$ applied to the MIS capacitor Q4 rises, the potential N11 of the drain of the transistor Q2 rises and, therefore, the gate of the transistor Q3 rises because the transistor Q2 is in a cutoff state. Thereby, the transistor Q3 is turned on and the potential WL11 at the end of the non-selected word line is clamped to $V_{SS}$.

FIGS. 5A and 5B illustrate the structure of a clamp circuit used in a semiconductor memory device as another embodiment of the present invention. FIG. 5A illustrates the signals of every portion of the clamp circuit when the word line connected to the clamp circuit is in a selected condition. FIG. 5B illustrates the signals of very portion of the word line when the word line is in a non-selected condition. The clamp circuit of FIGS. 5A and 5B is composed of cross-coupled transistors Q2 and Q3, a depletion-type transistor Q5 connected to the drain of the transistor Q2, and so on. The gate and the source of the depletion-type transistor Q5 are commonly connected, and a clamp-activating clock $\phi_{CA}$ is applied to the drain thereof.

The operation of the circuit of FIGS. 5A and 5B is explained with reference to FIG. 6. When the word line is in a selected condition, the output WL00 of the word decoder WD shown in FIG. 5A starts to rise to a high potential level near the time $t_0$. In this case, since the clamp-activating clock $\phi_{CA}$ is at a low potential level, both of the drain potentials N01 and WL01 of the transistors Q2 and Q3 are low, and the transistors Q2 and Q3 are both in a turned off state. Therefore, according to the rise of the output potential WL00 of the word decoder WD, the drain potential WL01 of the transistor Q3 rises to a high potential level without being affected much by the resistance of the word line. At the time $t_1$ when the drain potential WL01 of the transistor Q3 has almost reached a high level, even if the clamp-activating clock $\phi_{CA}$ is rendered to be a high level, the drain potential N01 of the transistor Q2 is maintained at a low level and the transistor Q3 is maintained in a cutoff state because the transistor Q2 was previously turned on.

When the word line connected to the clamp circuit is in a non-selected condition, the output potential WL10 of the word decoder WD and the drain potential WL11 of the transistor Q3 shown in FIG. 5A are both maintained at a low potential level. At the time $t_1$ when the clamp-activating clock $\phi_{CA}$ rises, the transistor Q2 is in a cutoff state, and, therefore, the transistor Q3 is turned on and clamps the potential WL11 at the end of the non-selected word line to a low-level voltage $V_{SS}$.

FIGS. 7A and 7B illustrate the structure of a clamp circuit used in a semiconductor memory device of still another embodiment of the present invention. The clamp circuit of FIGS. 7A and 7B further comprises a MIS transistor $Q_6$ which is connected in parallel to the transistor $Q_2$ of the clamp circuit of FIGS. 3A and 3B and whose gate receives an inverted clamp-activating clock $\overline{\phi_{CA}}$. The other portions are the same as those of the clamp circuit of FIGS. 3A and 3B.

As illustrated in FIG. 8, since the inverted clamp activating clock $\overline{\phi_{CA}}$ is high and the transistor $Q_6$ is turned on during the reset period, i.e., before the time $t_0$, the node N01 of FIG. 7A does not become a floating state but the potential thereof is clamped to $V_{SS}$. In this condition, the transistor $Q_3$ is surely turned off and the potential WL01 of the word line becomes sufficiently high.

As was mentioned above, according to the present invention, the word line clamp circuit is activated after the potential of the selected word line has become sufficiently high. Therefore, the transistor Q3 of the clamp circuit is in a cutoff state during the rising time of the word line potential, and the potential rise of the word line is not arrested by the clamp circuit even when the resistance of the word line is relatively large. This results in a reliable selection operation of the word line. It should be noted that, in each of the non-selected word lines, since the word line potential is reliably clamped to a low level by the addition of a clamp-activating clock, it is possible to prevent variation of the potential of each non-selected word line due to noise components and so on.

We claim:

1. A semiconductor memory device operatively connected to receive a control signal, comprising:
   word lines having a selected or non-selected state;
   clamp circuits, each of said clamp circuits operatively connected to a corresponding one of said word lines for clamping the potential of a non-selected word line to a reference potential, said clamp circuits forming a flip-flop having a first terminal operatively connected to said corresponding one of said word lines and a second terminal operatively connected to receive the control signal for operating each of said clamp circuits, the control signal being applied when the potential of a selected one of said word lines exceeds at least the potential necessary for inverting the condition of said flip-flop, each of said clamp circuits including:
- a first MIS transistor having a gate, having a source operatively connected to ground, and having a drain; and
- a second MIS transistor having a gate operatively connected to the drain of said first transistor, having a source operatively connected to ground, and having a drain operatively connected to the gate of said first transistor, the drain of said first MIS transistor corresponding to said first terminal and the drain of said second MIS transistor corresponding to said second terminal.

2. A semiconductor memory device according to claim 1, wherein said control signal is applied after the potential of said selected word line exceeds the threshold potential of said second MIS transistor.

3. A semiconductor memory device according to claim 1, further comprising a capacitor, wherein said control signal is applied to said second terminal via said capacitor.

4. A semiconductor memory device according to claim 3, wherein said capacitor is an MIS capacitor.

5. A semiconductor memory device according to claim 3 or 4, wherein said control signal is inverted, wherein each of said clamp circuits further comprises a third MIS transistor, operatively connected in parallel with said second MIS transistor, being turned on and off by the inverted signal of said control signal.

6. A semiconductor memory device according to claim 1, further comprising a resistor element, wherein said control signal is applied to said second terminal via said resistor element.

7. A semiconductor memory device according to claim 6, wherein said resistor element comprises a depletion-type MIS transistor having a gate and a source, the gate and source being commonly connected.

8. A semiconductor memory device having word lines, the word lines having a selected or non-selected state, and operatively connected to receive a control signal, comprising:
clamp circuits, respectively, operatively connected to the word lines, for clamping the potential of a non-selected word line to a reference potential, each of said clamp circuits forming a flip-flop having a first terminal operatively connected to receive the control signal and having a second terminal, each of said clamp circuits including:
- a first MIS transistor having a gate, having a drain corresponding to said first terminal of said flip-flop, and having a source operatively connected to ground; and
- a second MIS transistor having a gate operatively connected to said drain of said first MIS transistor, having a source operatively connected to ground and having a drain corresponding to said second terminal of said flip-flop and operatively connected to the gate of said first MIS transistor.

9. A semiconductor device according to claim 8, further comprising a capacitor having a first terminal operatively connected to the connecting point of the gate of said second MIS transistor and the drain of said first MIS transistor, and having a second terminal operatively connected to receive said control signal.

* * * * *

UNITED STATES PATENT AND TRADEMARK OFFICE
CERTIFICATE OF CORRECTION

PATENT NO. : 4,592,020
DATED : MAY 27, 1986
INVENTOR(S) : YOSHIHIRO TAKEMAE ET AL.

It is certified that error appears in the above-identified patent and that said Letters Patent is hereby corrected as shown below:

Col. 1, line 55, "controls" should be --control--.

Col. 3, line 55, "very" should be --every--.

Col. 4, line 30, "$\phi_{CA}$" should be --$\overline{\phi}_{CA}$--;

line 33, "$\phi_{CA}$" should be --$\overline{\phi}_{CA}$--.

Signed and Sealed this

Nineteenth Day of August 1986

[SEAL]

Attest:

DONALD J. QUIGG

Attesting Officer

Commissioner of Patents and Trademarks